United States Patent
Fujii

(10) Patent No.: US 9,960,158 B2
(45) Date of Patent: May 1, 2018

(54) SEMICONDUCTOR DEVICE

(71) Applicant: Mitsubishi Electric Corporation, Tokyo (JP)

(72) Inventor: Hidenori Fujii, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days. days.

(21) Appl. No.: 15/480,593

(22) Filed: Apr. 6, 2017

(65) Prior Publication Data

US 2018/0090487 A1     Mar. 29, 2018

(30) Foreign Application Priority Data

Sep. 26, 2016 (JP) .................. 2016-186769

(51) Int. Cl.
| | |
|---|---|
| *H01L 27/102* | (2006.01) |
| *H01L 27/06* | (2006.01) |
| *H01L 29/739* | (2006.01) |
| *H01L 29/861* | (2006.01) |
| *H01L 29/66* | (2006.01) |
| *H01L 21/265* | (2006.01) |
| *H01L 21/324* | (2006.01) |

(52) U.S. Cl.
CPC .... *H01L 27/0664* (2013.01); *H01L 21/26513* (2013.01); *H01L 21/324* (2013.01); *H01L 29/6609* (2013.01); *H01L 29/66333* (2013.01); *H01L 29/7395* (2013.01); *H01L 29/861* (2013.01)

(58) Field of Classification Search
CPC ............ H01L 29/66325; H01L 29/861; H01L 29/7395; H01L 29/66333; H01L 29/6609; H01L 29/7816
See application file for complete search history.

(56) References Cited

U.S. PATENT DOCUMENTS

| | | |
|---|---|---|
| 7,456,484 B2 | 11/2008 | Ozeki et al. |
| 7,800,204 B2 | 9/2010 | Fujii |
| 8,420,496 B2 | 4/2013 | Fujii |
| 2010/0140658 A1* | 6/2010 | Koyama ............... H01L 29/861 257/140 |
| 2017/0069625 A1 | 3/2017 | Hirabayashi et al. |

FOREIGN PATENT DOCUMENTS

| | | |
|---|---|---|
| JP | 2007-184486 | 7/2007 |
| JP | 5309360 B2 | 10/2013 |
| JP | 2015-211149 | 11/2015 |

* cited by examiner

*Primary Examiner* — Cuong Q Nguyen
(74) *Attorney, Agent, or Firm* — Studebaker & Brackett PC

(57) ABSTRACT

A semiconductor device includes a multilayer structure including an n− i layer, a p anode layer formed on the front surface of the n− i layer, an n− buffer layer formed on the back surface of the n− i layer, an n+ cathode layer and a p collector layer formed on the back surface of the n− buffer layer or on the back surfaces of the n− i layer and the n− buffer layer such that the n+ cathode layer and the p collector layer are adjacent to each other in a plan view or adjacent portions thereof overlap each other in a plan view, a front surface electrode, and a back surface electrode. A vertical position in the multilayer structure of the n+ cathode layer in the multilayer structure differs from that of the p collector layer.

8 Claims, 4 Drawing Sheets

F I G . 7
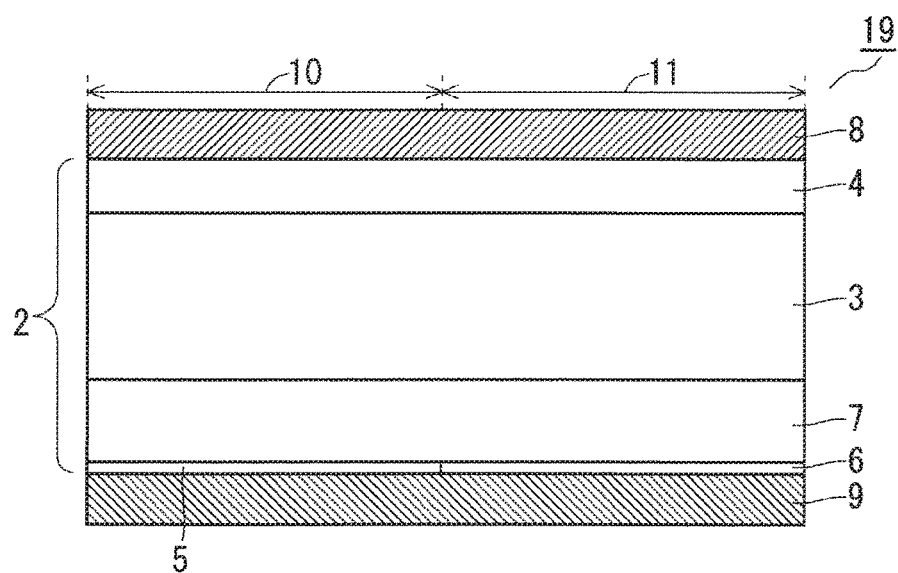

SEMICONDUCTOR DEVICE

BACKGROUND OF THE INVENTION

Field of the Invention

The present invention relates to a semiconductor device, and more particularly, to a back surface structure of a power semiconductor device.

Description of the Background Art

In recent years, relaxed field of cathode (RFC) diodes and reverse conducting insulated gate bipolar transistors (RC-IGBT) and the like are manufactured as power semiconductor devices. Having a pn pattern on the back surface thereof, such an RFC diode and an RC-IGBT, enables controlling of electrical properties. The "pn pattern" used herein refers to a state in which a region where p-type impurities are formed and a region where n-type impurities are formed are adjacent to each other in a plan view on a back surface of a semiconductor substrate configuring a power semiconductor device.

When a p-type impurity region and an n-type impurity region are formed by high-energy implantation or high-dose implantation to form a pn pattern on the back surface of a power semiconductor device, such implantation increases damage to a semiconductor substrate. To solve the problem, a stepwise impurity concentration profile, in which the back surface of a semiconductor substrate including Si is melted to have a uniform concentration of impurities in an impurities-introduced region, may be applied to power semiconductor devices (see Japanese Patent No. 5309360, for example). Techniques of forming an electrode having ohmic characteristics suitable for a p-type and an n-type on the entire back surface of a semiconductor substrate of a power semiconductor device are disclosed in Japanese Patent Application Laid-Open Nos. 2007-184486 and 2015-211149, for example.

When the technique disclosed in Japanese Patent No. 5309360 is applied to a power semiconductor device, a p-type impurity region and an n-type impurity region are joined only in a region having a depth equal to or less than 1 μm from the back surface of the semiconductor substrate so as to melt the back surface. Accordingly, it is hard to control the electrical properties of a pnp region formed in the p-type impurity region and the electrical properties of a pn region formed in the n-type impurity region independently. In other words, it is hard to control an operation of the pnp region and an operation of the pn region independently.

According to the techniques disclosed in Japanese Patent Application Laid-Open Nos. 2007-184486 and 2015-211149, the p-type impurity region and the n-type impurity region are joined to each other at a shallow depth and the depths thereof are substantially the same. Accordingly, it is hard to provide electrodes with ohmic characteristics suitable for the p-type and the n-type respectively on the p-type impurity region and the n-type impurity region.

SUMMARY OF THE INVENTION

An object of the present invention is to provide a semiconductor device capable of controlling an operation of the pnp region and an operation of the pn region independently.

According to an aspect of the present invention, there is provided a semiconductor device including a multilayer structure that includes a first semiconductor layer of a first conductivity type, a second semiconductor layer of a second conductivity type formed on a front surface of the first semiconductor layer, a third semiconductor layer of the first conductivity type formed on a back surface of the first semiconductor layer, a fourth semiconductor layer of the first conductivity type and a fifth semiconductor layer of the second conductivity type that are formed on a back surface of the third semiconductor layer or on the back surface of each of the first semiconductor layer and the third semiconductor layer in such a manner that the fourth semiconductor layer and the fifth semiconductor layer are situated adjacent to each other in a plan view or adjacent portions of the fourth semiconductor layer and the fifth semiconductor layer overlap each other in a plan view, a first electrode formed to cover a front surface of the second semiconductor layer, and a second electrode formed to cover a back surface of each of the fourth semiconductor layer and the fifth semiconductor layer. In the semiconductor device, a vertical position in the multilayer structure of the fourth semiconductor layer and a vertical position in the multilayer structure of the fifth semiconductor layer differ from each other.

According to the aspect of the present invention, a semiconductor device includes a multilayer structure that includes a first semiconductor layer of a first conductivity type, a second semiconductor layer of a second conductivity type formed on a front surface of the first semiconductor layer, a third semiconductor layer of the first conductivity type formed on a back surface of the first semiconductor layer, a fourth semiconductor layer of the first conductivity type and a fifth semiconductor layer of the second conductivity type that are formed on a back surface of the third semiconductor layer or on the back surface of each of the first semiconductor layer and the third semiconductor layer in such a manner that the fourth semiconductor layer and the fifth semiconductor layer are situated adjacent to each other in a plan view or adjacent portions of the fourth semiconductor layer and the fifth semiconductor layer overlap each other in a plan view, a first electrode formed to cover a front surface of the second semiconductor layer, and a second electrode formed to cover a back surface of each of the fourth semiconductor layer and the fifth semiconductor layer, and a vertical position in the multilayer structure of the fourth semiconductor layer and a vertical position in the multilayer structure of the fifth semiconductor layer differ from each other. With this configuration, the operation of the pnp region and the operation of the pn region can be controlled independently.

These and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a sectional view of an example of a configuration of a semiconductor device according to a premise art.

DESCRIPTION OF THE PREFERRED EMBODIMENTS

Figure 1:
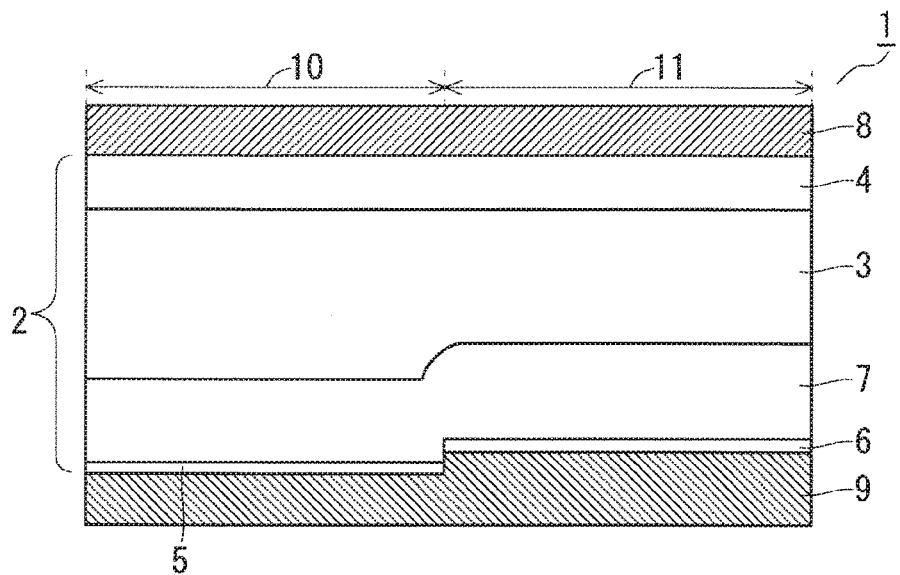
FIG. 1 is a sectional view illustrating an example of a configuration of a semiconductor device according to a first preferred embodiment of the present invention.

Preferred embodiments of the present invention are described below with reference to the drawings.

<Premise Art>

To begin with, a premise art of the present invention is described.

FIG. 7 is a sectional view of an example of a configuration of a semiconductor device 19 according to the premise art.

The semiconductor device 19 includes a semiconductor substrate 2 formed of silicon (Si), a front surface electrode 8 which is a first electrode formed on the front surface of the semiconductor substrate 2, and a back surface electrode 9 which is a second electrode formed on the back surface of the semiconductor substrate 2. The semiconductor substrate 2 includes an n− i layer 3, a p anode layer 4, an n+ cathode layer 5, a p collector layer 6, and an n− buffer layer 7. A pin region 10 has a multilayer structure including the p anode layer 4, the n− i layer 3, the n− buffer layer 7, and the n+ cathode layer 5. A pnp region 11 has a multilayer structure including the p anode layer 4, the n− i layer 3, the n− buffer layer 7, and the p collector layer 6.

Each of the "n" and "p" used herein refers to a conductivity type, and the n-type refers to a first conductivity type, and the p-type refers to a second conductivity type. The "n−" used herein indicates that the n-type impurity concentration is relatively low as compared to the other n-type impurity concentrations. The "n+" used herein indicates that the n-type impurity concentration is relatively high as compared to the other n-type impurity concentrations. Note that the n-type refers to the first conductivity type and the p-type refers to the second conductivity type in the following description, but the p-type may refer to the first conductivity type and the n-type may refer to the second conductivity type.

The n− i layer 3 which is a first semiconductor layer of the first conductivity type is formed as an n-type intrinsic semiconductor layer. The p anode layer 4 which is a second semiconductor layer of the second conductivity type is positioned closer to the front surface of the semiconductor substrate 2 than the n− i layer 3. The n− buffer layer 7 which is a third semiconductor layer of the first conductivity type is positioned closer to the back surface of the semiconductor substrate 2 than the n− i layer 3. The n+ cathode layer 5 which is a fourth semiconductor layer of the first conductivity type and the p collector layer 6 which is a fifth semiconductor layer of the second conductivity type are positioned closer to the back surface of the semiconductor substrate 2 than the n− i layer 3. The n+ cathode layer 5 and the p collector layer 6 are adjacent to each other in a plan view. In other words, the n+ cathode layer 5 and the p collector layer 6 form a pn pattern.

Referring to FIG. 7, the n+ cathode layer 5 and the p collector layer 6 are formed at substantially the same depth from the back surface of the semiconductor substrate 2. In other words, the vertical position in the multilayer structure of the n+ cathode layer 5 in the pin region 10 and the vertical position in the multilayer structure of the p collector layer 6 in the pnp region 11 are substantially the same. As described above, this structure makes it difficult to control the operation of the pin region 10 and the operation of the pnp region 11 independently.

The present invention has been made to solve such a problem and is described in detail below.

First Preferred Embodiment

<Structure>

The structures of the semiconductor devices according to the preferred embodiments of the present invention are described below. FIG. 1 is a sectional view of an example of a structure of a semiconductor device 1 according to the first preferred embodiment.

According to the semiconductor device 1 of the first preferred embodiment, the thickness of the n− i layer 3 in the pin region 10 differs from the thickness of the n− i layer 3 in the pnp region 11. Specifically, the thickness of the n− i layer 3 in the pnp region 11 is less than that of the n− i layer 3 in the pin region 10. The vertical position in the multilayer structure of the n+ cathode layer 5 in the pin region 10 and the vertical position in the multilayer structure of the p collector layer 6 in the pnp region 11 differ from each other. The other structures are the same as those of the semiconductor device 19 according to the underlying art shown in FIG. 7, and thus the detailed descriptions thereof are omitted.

According to the semiconductor device 1, a difference between the thickness of the n− i layer 3 in the pin region 10 and the thickness of the n− i layer 3 in the pnp region 11 is the same as a level difference between the n+ cathode layer 5 and the p collector layer 6. The level difference between the n− cathode layer 5 and the p collector layer 6 refers to a level difference between the interface between the n+ cathode layer 5 and the back surface electrode 9 and the interface between the p collector layer 6 and the back surface electrode 9.

Referring to FIG. 1, the n+ cathode layer 5 and the p collector layer 6 are formed on the back surface of the n− buffer layer 7. The n+ cathode layer 5 and the p collector layer 6 are adjacent to each other in a plan view, and the adjacent portions of the n+ cathode layer 5 and the p collector layer 6 do not overlap each other in a plan view.

<Manufacturing Method>

A manufacturing method of the semiconductor device 1 is described below.

First, the semiconductor substrate 2 including the n− i layer 3 is prepared. Then, boron (B) ions are implanted into the semiconductor substrate 2 from the front surface thereof, and a drive-in step is performed to form the p anode layer 4. The implant dose of the B ions is 1E13 to 1E16 (1/cm$^2$). The drive-in step is carried out under conditions of 900° C. to 1200° C. for 30 to 120 minutes.

The front surface electrode 8 is then formed to cover the p anode layer 4. The back surface of the semiconductor substrate 2 is subsequently grinded until the semiconductor substrate 2 has a desired thickness. After the grinding, phosphorus (P) ions which are to be included in the n+ cathode layer 5 are implanted into the entire back surface of the semiconductor substrate 2. The implant dose of the P ions is 1E14 to 1E16 (1/cm$^2$).

Next, a pn pattern in which a region for the n+ cathode layer 5 is masked and a region for the p collector layer 6 is opened, is formed on the back surface of the semiconductor substrate 2, and then the semiconductor substrate 2 in the region for the p collector layer 6 is etched until the semiconductor substrate 2 has a desired thickness. After the etching, B ions which are to be included in the p collector layer 6 are implanted into the region for the p collector layer 6. The implant dose of the B ions is 1E13 to 1E16 (1/cm$^2$). With these steps, the n+ cathode layer 5 and the p collector layer 6 are formed.

The pn pattern is subsequently removed and then, P ions are implanted into the semiconductor substrate 2 from the back surface thereof through the n+ cathode layer 5 and the p collector layer 6 to form the n− buffer layer 7. The implant dose of the P ions is 1E13 to 1E15 (1/cm$^2$). With these steps, the n− buffer layer 7 of which n-type impurity concentration is higher than that of the n− i layer 3 is formed.

Then, the semiconductor substrate 2 is subjected to a thermal treatment to activate the n+ cathode layer 5, the p collector layer 6, and the n− buffer layer 7. As the thermal treatment, laser annealing and the like are used.

As a final step, the back surface electrode 9 having a thickness of several micrometers (μm) is formed to cover the n+ cathode layer 5 and the p collector layer 6 by plating, sputtering, or vapor deposition. With these steps, the semiconductor device 1 having the pin region 10 and the pnp region 11 is completed.

According to the first preferred embodiment, the thickness of the n− i layer 3 in the pin region 10 and the thickness of the n− i layer 3 in the pnp region 11 differ from each other, and thus the operation of the pin region 10 and the operation of the pnp region 11 can be controlled independently.

The thickness of the n− i layer 3 in the pnp region 11 is less than that of the n− i layer 3 in the pin region 10. Accordingly, low on-resistance and low switching losses can be achieved in IGBTs, and the breakdown strength in recovery operations can be improved in diodes.

Note that FIG. 1 illustrates a case in which the semiconductor substrate 2 includes the n− i layer 3, but the case is not limited thereto. Instead of the n− i layer 3, the semiconductor substrate 2 may include a semiconductor layer containing a larger amount of n-type impurities. In such a case, the pin region 10 in FIG. 1 becomes a pn region.

Second Preferred Embodiment

Figure 2:
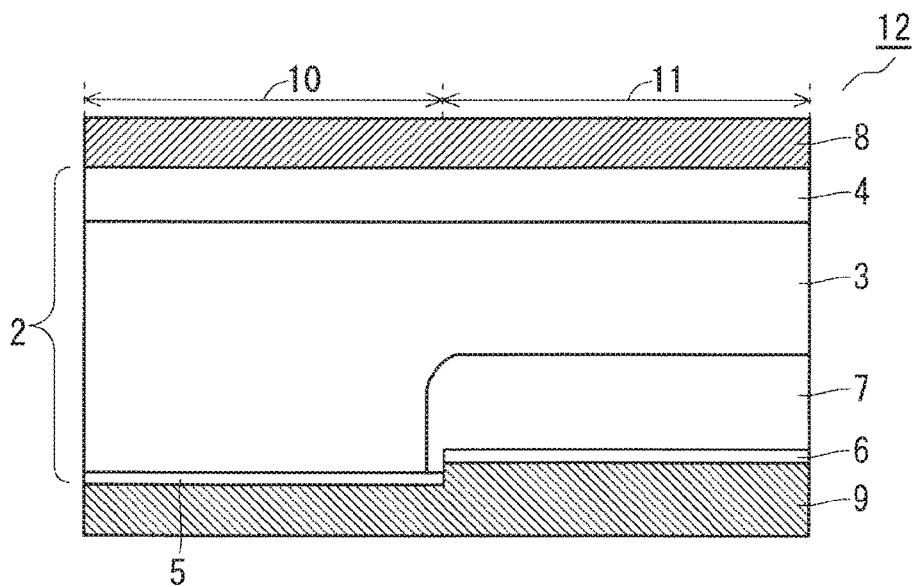
FIG. 2 is a sectional view illustrating an example of a configuration of a semiconductor device according to a second preferred embodiment of the present invention.

FIG. 2 is a sectional view of an example of a configuration of a semiconductor device 12 according to a second preferred embodiment of the present invention.

In the semiconductor device 12 according to the second preferred embodiment, a difference between the thickness of the n− i layer 3 in the pin region 10 and the thickness of the n− i layer 3 in the pnp region 11 corresponds to a thickness obtained by adding a level difference between the n+ cathode layer 5 and the p collector layer 6 to the thickness of the n− buffer layer 7 in the pnp region 11. The other structures are the same as those of the semiconductor device 1 according to the first preferred embodiment shown in FIG. 1, and thus the detailed descriptions thereof are omitted.

Referring to FIG. 2, the n− buffer layer 7 is not formed in the pin region 10, and is formed in the pnp region 11. The n+ cathode layer 5 is formed on the back surface of the n− i layer 3, and the p collector layer 6 is formed on the back surface of the n− buffer layer 7. The n+ cathode layer 5 and the p collector layer 6 are adjacent to each other in a plan view, and the adjacent portions of the n+ cathode layer 5 and the p collector layer 6 do not overlap each other in a plan view.

A manufacturing method of the semiconductor device 12 is described below. The following description focuses on differences from the manufacturing method of the semiconductor device 1 according to the first preferred embodiment. The method other than the following differences is the same as that of the first preferred embodiment.

A pn pattern in which a region for the n+ cathode layer 5 is masked and a region for the p collector layer 6 is opened, is formed on the back surface of the semiconductor substrate 2, and then the semiconductor substrate 2 in the region for the p collector layer 6 is etched until the semiconductor substrate 2 has a desired thickness. Then, B ions which are to be included in the p collector layer 6 are implanted into the region for the p collector layer 6. With these steps, the n+ cathode layer 5 and the p collector layer 6 are formed.

Next, in a state in which the pn pattern is formed, P ions are implanted into the semiconductor substrate 2 from the back surface thereof through the p collector layer 6 to form the n− buffer layer 7. The implant dose of the P ions is 1E13 to 1E15 (1/cm$^2$). Then, the pn pattern is removed to form the back surface electrode 9.

From the above, the second preferred embodiment provides the same effects as the first preferred embodiment. In addition, the pressure resistance of the pin region 10 can be improved, since the n− buffer layer 7 is not formed in the pin region 10 and the concentration of n-type impurities is reduced as compared to the pin region 10 shown in FIG. 1.

Third Preferred Embodiment

Figure 3:
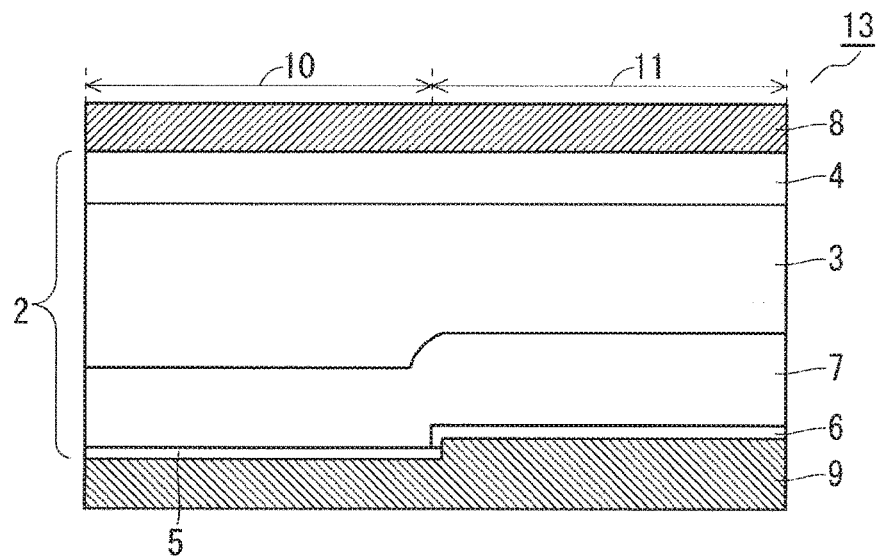
FIG. 3 is a sectional view illustrating an example of a configuration of a semiconductor device according to a third preferred embodiment of the present invention.

FIG. 3 is a sectional view of an example of a configuration of a semiconductor device 13 according to a third preferred embodiment of the present invention.

In the semiconductor device 13 according to the third preferred embodiment, the vertical position in the multilayer structure of the p collector layer 6 in the pnp region 11 is closer to the n− i layer 3 than the vertical position in the multilayer structure of the n+ cathode layer 5 in the pin region 10, and the adjacent portions of the n+ cathode layer 5 and the p collector layer 6 overlap each other in a plan view. The p collector layer 6 is provided between the n+ cathode layer 5 and the p collector layer 6 at a position where the adjacent portions overlap each other in a plan view. The other structures are the same as those of the semiconductor device 1 in the first preferred embodiment shown in FIG. 1, and thus the detailed descriptions thereof are omitted.

Referring to FIG. 3, the n+ cathode layer 5 and the p collector layer 6 are formed on the back surface of the n− buffer layer 7. The n+ cathode layer 5 and the p collector layer 6 are adjacent to each other in a plan view, and the adjacent portions of the n+ cathode layer 5 and the p collector layer 6 overlap each other in a plan view.

A manufacturing method of the semiconductor device 13 is described below. The following description focuses on differences from the manufacturing method of the semiconductor device 1 according to the first preferred embodiment. The method other than the following differences is the same as that of the first preferred embodiment.

A pn pattern in which a region for the n+ cathode layer 5 is masked and a region for the p collector layer 6 is opened, is formed on the back surface of the semiconductor substrate 2, and then the semiconductor substrate 2 in the region for the p collector layer 6 is etched until the semiconductor substrate 2 has a desired thickness. Then, B ions which are to be included in the p collector layer 6 are implanted into the region for the p collector layer 6 by a rotational ion implantation. The "rotational ion implantation" used herein refers to a technique for implanting ions while rotating the semiconductor substrate 2.

From the above, the third preferred embodiment provides the same effects as the first preferred embodiment. In addition, a leakage current can be reduced since the n− buffer layer 7 with a low impurity concentration and the back surface electrode 9 are not in contact with each other.

Fourth Preferred Embodiment

Figure 4:
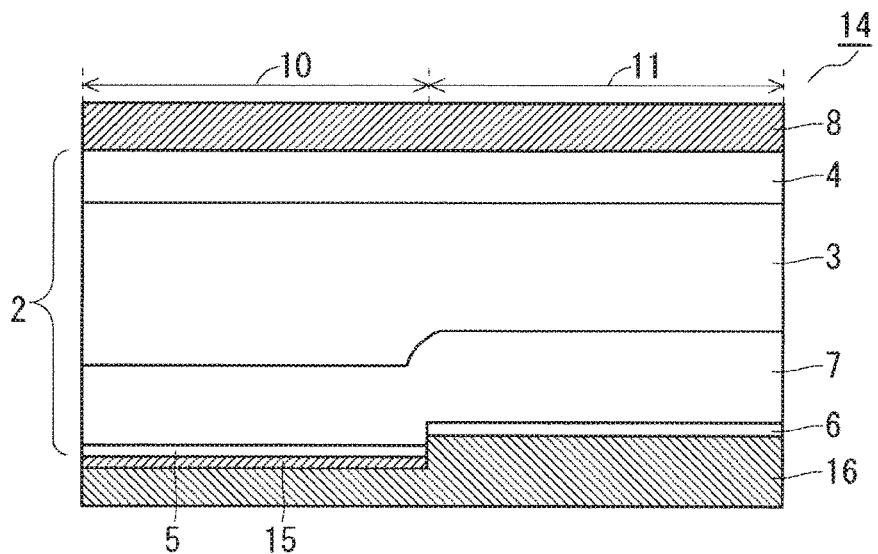
FIG. 4 is a sectional view illustrating an example of a configuration of a semiconductor device according to a fourth preferred embodiment of the present invention.

FIG. 4 is a sectional view of an example of a configuration of a semiconductor device 14 according to a fourth preferred embodiment of the present invention.

The semiconductor device 14 according to the fourth preferred embodiment includes an electrode for n-type 15 and an electrode for p-type 16. The electrode for n-type 15 is an electrode with ohmic characteristics suitable for n-type. The electrode for p-type 16 is an electrode with ohmic characteristics suitable for p-type.

The electrode for n-type 15 which is a third electrode is formed to cover the n+ cathode layer 5. The electrode for p-type 16 is formed to cover the electrode for n-type 15 and the p collector layer 6. A difference between the thickness of the n− i layer 3 in the pin region 10 and the thickness of the n− i layer 3 in the pnp region 11 is the same as a thickness obtained by adding a level difference between the n+ cathode layer 5 and the p collector layer 6 to the thickness of the electrode for n-type 15. The other structures are the same as those of the semiconductor device 1 according to the first preferred embodiment shown in FIG. 1, and thus the detailed descriptions thereof are omitted.

Referring to FIG. 4, the n+ cathode layer 5 and the p collector layer 6 are formed on the back surface of the n− buffer layer 7. The n+ cathode layer 5 and the p collector layer 6 are adjacent to each other in a plan view, and the adjacent portions of the n+ cathode layer 5 and the p collector layer 6 do not overlap each other in a plan view.

A manufacturing method of the semiconductor device 14 is described below. The following description focuses on differences from the manufacturing method of the semiconductor device 1 according to the first preferred embodiment. The method other than the following differences is the same as that of the first preferred embodiment.

After the n− buffer layer 7 is formed, the electrode for n-type 15 is formed on the n+ cathode layer 5. Then, the electrode for p-type 16 is formed to cover the electrode for n-type 15 and the p collector layer 6.

From the above, the fourth preferred embodiment provides the same effects as the first preferred embodiment. In addition, the ohmic characteristics are improved, since the electrode for n-type 15 is formed for the n+ cathode layer 5 and the electrode for p-type 16 is formed for the p collector layer 6.

Fifth Preferred Embodiment

Figure 5:
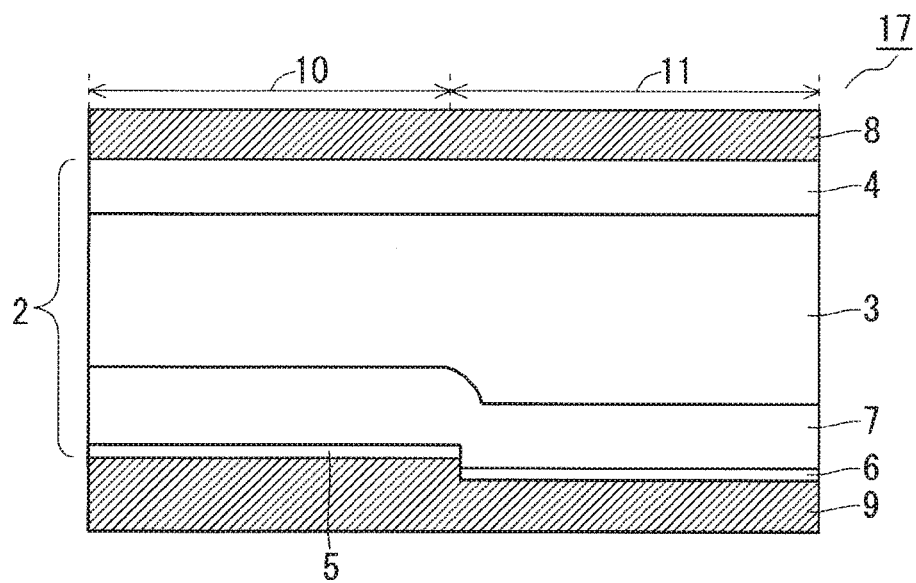
FIGS. 5 and 6 are sectional views each illustrating an example of a configuration of a semiconductor device according to a fifth preferred embodiment of the present invention.

FIG. 5 is a sectional view of an example of a configuration of a semiconductor device 17 according to a fifth preferred embodiment of the present invention.

In the semiconductor device 17, the thickness of the n− i layer 3 in the pin region 10 is less than that of the n− i layer 3 in the pnp region 11. The other structures are the same as those of the semiconductor device 1 in the first preferred embodiment shown in FIG. 1, and thus the detailed descriptions thereof are omitted.

Referring to FIG. 5, the n+ cathode layer 5 and the p collector layer 6 are formed on the back surface of the n− buffer layer 7. The n+ cathode layer 5 and the p collector layer 6 are adjacent to each other in a plan view, and the adjacent portions of the n+ cathode layer 5 and the p collector layer 6 do not overlap each other in a plan view.

A manufacturing method of the semiconductor device 17 is described below. The following description focuses on differences from the manufacturing method of the semiconductor device 1 according to the first preferred embodiment. The method other than the following differences is the same as that of the first preferred embodiment.

After the front surface electrode 8 is formed and the semiconductor substrate 2 is grinded, B ions which are to be included in the p collector layer 6 are implanted into the entire back surface of the semiconductor substrate 2.

Next, a pn pattern in which a region for the p collector layer 6 is masked and a region for the n+ cathode layer 5 is opened, is formed on the back surface of the semiconductor substrate 2, and then the semiconductor substrate 2 in the region for the n+ cathode layer 5 is etched until the semiconductor substrate 2 has a desired thickness. Then, P ions which are to be included in the n+ cathode layer 5 are implanted into the region for the n+ cathode layer 5.

After removing the pn pattern, P ions are implanted into the semiconductor substrate 2 from the back surface thereof through the n+ cathode layer 5 and the p collector layer 6 to form the n− buffer layer 7.

From the above, according to the fifth preferred embodiment, the operation of the pin region 10 and the operation of the pnp region 11 can be controlled independently. In addition, the thickness of the n− i layer 3 in the pin region 10 is less than that of the n− i layer 3 in the pnp region 11. This configuration allows a diode to have a low on-resistance as well as a low recovery loss.

Figure 6:
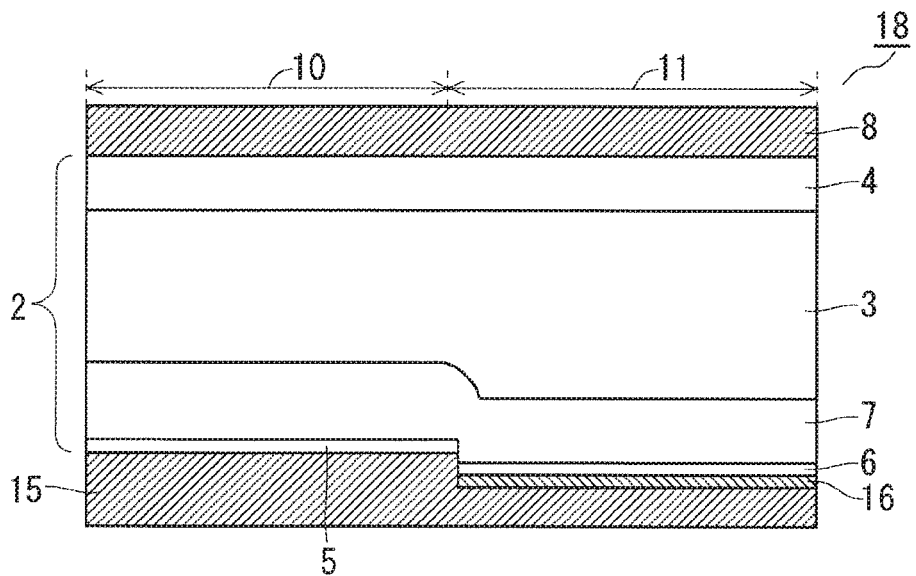

Referring to FIG. 6, the semiconductor device 18 may include the electrode for n-type 15 and the electrode for p-type 16. The electrode for p-type 16 is formed to cover the p collector layer 6. The electrode for n-type 15 is formed to cover the n+ cathode layer 5 and the electrode for p-type 16. In this case, the electrode for n-type 15 is formed for the n+ cathode layer 5 and the electrode for p-type 16 is formed for the p collector layer 6 as in the fourth preferred embodiment. Accordingly, the ohmic characteristics are improved.

In the semiconductor devices 17, 18 shown in FIGS. 5 and 6, the vertical position in the multilayer structure of the n+ cathode layer 5 in the pin region 10 is closer to the n− i layer 3 than the vertical position in the multilayer structure of the p collector layer 6 in the pnp region 11, and the adjacent portions of the n+ cathode layer 5 and the p collector layer 6 may overlap each other in a plan view. The n− cathode layer 5 may be provided between the n+ cathode layer 5 and the p collector layer 6 at a position where the adjacent portions overlap each other in a plan view. In this case, a leakage current can be reduced, since the n− buffer layer 7 with a low impurity concentration and the back surface electrode 9 are not in contact with each other as in the third preferred embodiment.

Note that the above embodiments may be freely combined with each other, or each of the above embodiments may be modified or omitted as appropriate, within the scope of the present invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a multilayer structure including:
   a first semiconductor layer of a first conductivity type;

a second semiconductor layer of a second conductivity type formed on a front surface of said first semiconductor layer;

a third semiconductor layer of said first conductivity type formed on a back surface of said first semiconductor layer;

a fourth semiconductor layer of said first conductivity type and a fifth semiconductor layer of said second conductivity type that are formed on a back surface of said third semiconductor layer or on the back surface of each of said first semiconductor layer and said third semiconductor layer in such a manner that said fourth semiconductor layer and said fifth semiconductor layer are situated adjacent to each other in a plan view or adjacent portions of said fourth semiconductor layer and said fifth semiconductor layer overlap each other in a plan view;

a first electrode formed to cover a front surface of said second semiconductor layer; and a second electrode formed to cover a back surface of each of said fourth semiconductor layer and said fifth semiconductor layer, wherein a vertical position of said fourth semiconductor layer in said multilayer structure and a vertical position of said fifth semiconductor layer in said multilayer structure differ from each other, and a thickness of said first semiconductor layer in said multilayer structure including said fourth semiconductor layer and a thickness of said first semiconductor layer in said multilayer structure including said fifth semiconductor layer differ from each other.

2. The semiconductor device according to claim 1, wherein a difference between the thickness of said first semiconductor layer in said multilayer structure including said fourth semiconductor layer and the thickness of said first semiconductor layer in said multilayer structure including said fifth semiconductor layer is identical to a level difference between said fourth semiconductor layer and said fifth semiconductor layer.

3. The semiconductor device according to claim 1, wherein a difference between the thickness of said first semiconductor layer in said multilayer structure including said fourth semiconductor layer and the thickness of said first semiconductor layer in said multilayer structure including said fifth semiconductor layer is identical to a thickness obtained by adding a level difference between said fourth semiconductor layer and said fifth semiconductor layer to a thickness of said third semiconductor layer in said multilayer structure including said fifth semiconductor layer.

4. The semiconductor device according to claim 1, wherein the vertical position in said multilayer structure of said fifth semiconductor layer is closer to said first semiconductor layer than the vertical position in said multilayer structure of said fourth semiconductor layer, and said fourth semiconductor layer and said fifth semiconductor layer are formed in such a manner that said adjacent portions overlap each other, and a portion of said fifth semiconductor layer extends to said fourth semiconductor layer at a position where said adjacent portions overlap each other.

5. The semiconductor device according to claim 1, wherein the vertical position in said multilayer structure of said fourth semiconductor layer is closer to said first semiconductor layer than the vertical position in said multilayer structure of said fifth semiconductor layer, and said fourth semiconductor layer and said fifth semiconductor layer are formed in such a manner that said adjacent portions overlap each other, and a portion of said fourth semiconductor layer extends to said fifth semiconductor layer at a position where the adjacent portions overlap each other.

6. The semiconductor device according to claim 1, wherein said multilayer structure further includes a third electrode formed between said fourth semiconductor layer and said second electrode, and a difference between the thickness of said first semiconductor layer in said multilayer structure including said fourth semiconductor layer and the thickness of said first semiconductor layer in said multilayer structure including said fifth semiconductor layer is identical to a thickness obtained by adding a level difference between said fourth semiconductor layer and said fifth semiconductor layer to a thickness of said third electrode.

7. The semiconductor device according to claim 1, wherein the thickness of said first semiconductor layer in said multilayer structure including said fifth semiconductor layer is less than the thickness of said first semiconductor layer in said multilayer structure including said fourth semiconductor layer.

8. The semiconductor device according to claim 1, wherein the thickness of said first semiconductor layer in said multilayer structure including said fourth semiconductor layer is less than the thickness of said first semiconductor layer in said multilayer structure including said fifth semiconductor layer.

* * * * *